US011043521B2

(12) United States Patent
Tang et al.

(10) Patent No.: US 11,043,521 B2
(45) Date of Patent: Jun. 22, 2021

(54) FREEFORM SURFACE OFF-AXIAL THREE-MIRROR IMAGING SYSTEM

(71) Applicants: Tsinghua University, Beijing (CN); HON HAI PRECISION INDUSTRY CO., LTD., New Taipei (TW)

(72) Inventors: Rui-rui Tang, Beijing (CN); Ben-qi Zhang, Beijing (CN); Jun Zhu, Beijing (CN); Guo-Fan Jin, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 431 days.

(21) Appl. No.: 16/231,535

(22) Filed: Dec. 23, 2018

(65) Prior Publication Data
US 2019/0221599 A1    Jul. 18, 2019

(30) Foreign Application Priority Data
Jan. 12, 2018    (CN) .......................... 201810033376.0

(51) Int. Cl.
*H01L 27/146* (2006.01)
*H04N 5/357* (2011.01)
*G02B 17/06* (2006.01)

(52) U.S. Cl.
CPC .... *H01L 27/14629* (2013.01); *G02B 17/0626* (2013.01); *G02B 17/0642* (2013.01); *H04N 5/35721* (2018.08)

(58) Field of Classification Search
CPC .......... H01L 27/14629; G02B 17/0642; G02B 17/0626; H04N 5/35721
See application file for complete search history.

(56) References Cited

U.S. PATENT DOCUMENTS

| 7,542,211 B2 * | 6/2009 | Togino ................. H04N 5/2254 359/637 |
| 10,416,452 B2 * | 9/2019 | Cheng ..................... G02B 17/08 |
| 2015/0253552 A1 | 9/2015 | Zhu et al. |

FOREIGN PATENT DOCUMENTS

CN    104898261    9/2015

* cited by examiner

*Primary Examiner* — Seung C Sohn
(74) *Attorney, Agent, or Firm* — ScienBiziP, P.C.

(57) ABSTRACT

A freeform surface off-axial three-mirror imaging system comprising a primary mirror, a secondary mirror, a tertiary mirror, and an image sensor. Each reflective surface of the primary mirror, the secondary mirror, and the tertiary mirror is an xy polynomial freeform surface. A field angle of the freeform surface off-axial three-mirror imaging system is larger than or equal to 60°×1°. An F-number of the freeform surface off-axial three-mirror imaging system is less than or equal to 2.5.

18 Claims, 11 Drawing Sheets

FREEFORM SURFACE OFF-AXIAL THREE-MIRROR IMAGING SYSTEM

CROSS-REFERENCE TO RELATED APPLICATIONS

This application claims all benefits accruing under 35 U.S.C. § 119 from China Patent Application No. 201810033376.0, field on Jan. 12, 2018 in the China National Intellectual Property Administration, disclosure of which is incorporated herein by reference. The application is also related to copending applications entitled, "METHOD OF DESIGNING FREEFORM SURFACE OFF-AXIAL THREE-MIRROR IMAGING SYSTEM", filed Dec. 14, 2018 Ser. No. 16/220,294.

FIELD

The subject matter herein generally relates to freeform surface off-axial three-mirror imaging systems.

BACKGROUND

Compared with conventional rotationally symmetric surfaces, freeform surfaces have asymmetric surfaces and more degrees of design freedom, which can reduce the aberrations and simplify the structure of the system. In recent years, freeform surfaces are often used in off-axial three-mirror imaging system.

Conventional freeform surface off-axial three-mirror imaging systems are mostly applied to a large field or a small F-number high resolution imaging. However, conventional freeform surface off-axial three-mirror imaging systems cannot simultaneously achieve the large field and small F-number, and cannot obtain high resolution images in a large imaging range.

BRIEF DESCRIPTION OF THE DRAWINGS

Implementations of the present technology will now be described, by way of example only, with reference to the attached figures, wherein.

DETAILED DESCRIPTION

Figure 1:
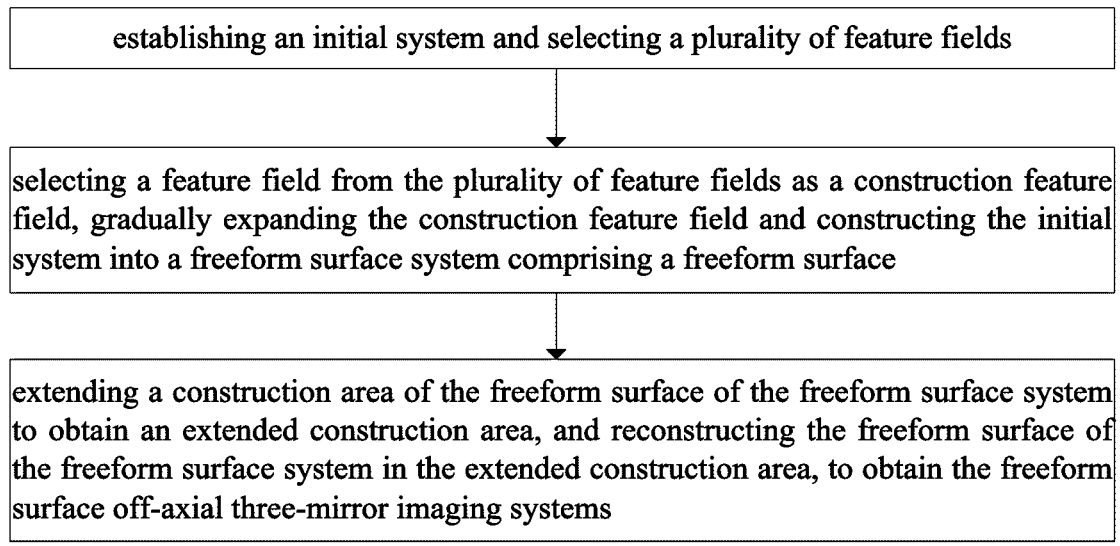
FIG. 1 is a flow diagram of an embodiment of a method of designing a freeform surface off-axial three-mirror imaging system.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "contact" is defined as a direct and physical contact. The term "substantially" is defined to be that while essentially conforming to the particular dimension, shape, or other feature that is described, the component is not or need not be exactly conforming to the description. The term "comprising," when utilized, means "including, but not necessarily limited to"; it specifically indicates open-ended inclusion or membership in the so-described combination, group, series, and the like.

Figure 2:
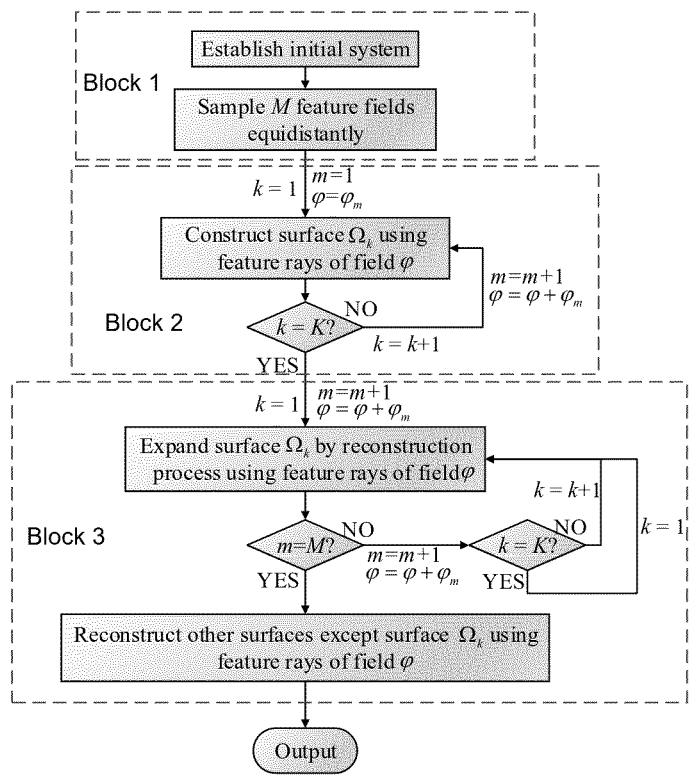
FIG. 2 is a flow diagram of an embodiment of a method of designing a freeform surface off-axial three-mirror imaging system.

FIG. 1 and FIG. 2 show one embodiment in relation to a method of designing an freeform surface off-axial three-mirror imaging system. The method comprises the following blocks:

block (B1), establishing an initial system and selecting a plurality of feature fields;

block (B2), selecting a feature field from the plurality of feature fields as a construction feature field, gradually expanding the construction feature field and constructing the initial system into a freeform surface system comprising a freeform surface; and block (B3), extending a construction area of the freeform surface of the freeform surface system to obtain an extended construction area, and reconstructing the freeform surface of the freeform surface system in the extended construction area, to obtain the freeform surface off-axial three-mirror imaging system.

In block (B1), the initial system comprises a plurality of initial surfaces, and each of the plurality of initial surfaces corresponds to one freeform surface of the freeform surface off-axial three-mirror imaging systems. The plurality of initial surfaces can be planar surfaces or spherical surfaces. The locations of the plurality of initial surfaces can be selected according to the actual needs of the freeform surface off-axial three-mirror imaging systems. The number of the plurality of initial surfaces can be selected according to the actual needs. In one embodiment, the initial system is an initial planar three-mirror imaging system, the initial planar three-mirror imaging system comprises three initial planar.

The number of the plurality of feature fields is much larger than the number of the initial surfaces of the initial system. In one embodiment, the number of the plurality of feature fields is more than 50 times of the number of the initial surfaces. In one embodiment, the number of the plurality of feature fields is 50 to 60 times of the number of the initial surfaces. The feature fields can be selected according to actual needs. In one embodiment, M feature fields are isometric sampled in sagittal direction and meridian direction, the M feature fields are defined as $\varphi_i$ (i=1, 2, ... M), and $(0, \varphi_{y0})$ is defined as a central field. In one embodiment, the initial system is the initial planar three-mirror imaging system, a field of the initial planar three-mirror imaging system in meridian direction is from about 8° to about 9°, and a field of the initial planar three-mirror imaging system in sagittal direction is from about −30° to about 30°. Referring to FIG. 2, the initial planar three-mirror imaging system is symmetric about a YOZ plane, thus, only half of the field in the sagittal direction can be considered. A feature field is sampled every 0.5°, three feature fields are sampled in the sagittal direction, and 61 feature fields are sampled in the meridian direction, therefore, 183 feature fields are selected.

K feature rays are selected in each of the M feature fields. A method of selecting the K feature rays comprises steps of: an aperture of each of the M fields is divided into N equal parts; and, P feature rays at different aperture positions in each of the N equal parts are selected. As such, K=M×N×P different feature rays correspond to different aperture positions and different fields are selected. The aperture can be circle, rectangle, square, oval or other shapes. In one embodiment, the aperture of each of the M fields is a circle, and a circular aperture of each of the M fields is divided into N angles with equal interval $\varphi$, as such, N=2π/$\varphi$; then, P different aperture positions are fixed along a radial direction of each of the N angles. Therefore, K=M×N×P different feature rays correspond to different aperture positions and different fields are selected. In one embodiment, the aperture of each field is divided into 14 equal parts; and, 7 feature rays at different aperture positions in each of the 14 equal parts are selected. As such, 98 different feature rays are selected in each field.

Figure 3:
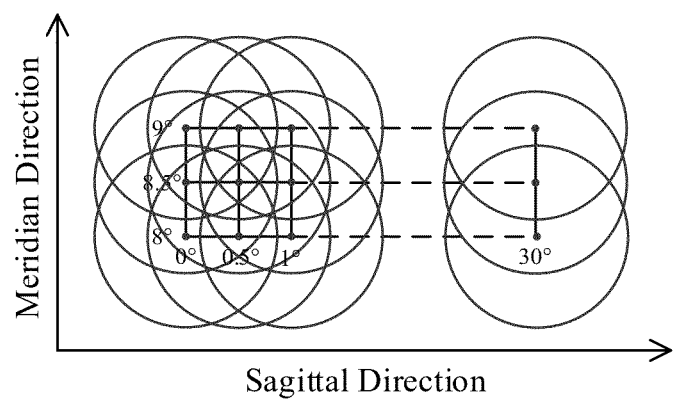
FIG. 3 is a method diagram of an embodiment of selecting feature fields.

In block (B1), the freeform surface off-axial three-mirror imaging system is usually symmetric in the sagittal direction, thus, when constructing the initial system into the freeform surface system, only the feature rays of a half field in the sagittal direction can be considered. Referring to FIG. 3, in one embodiment, the central field $(0, \varphi_{y0})$ is as a first construction feature field $\varphi_1$, during expanding the construction feature field, the construction feature field in the meridional direction is expanded in both positive and negative directions, the construction feature field in the sagittal direction is expanded in positive direction. In one embodiment, the initial system is the initial planar three-mirror imaging system, a field of the initial planar three-mirror imaging system in meridian direction is from about 8° to about 9°, the field range is only about 1°, thus, during expanding the construction feature field, the construction feature field is expanded only in the sagittal direction, and the three feature fields in the meridional direction are considered simultaneously in each step of construction.

Figure 4:
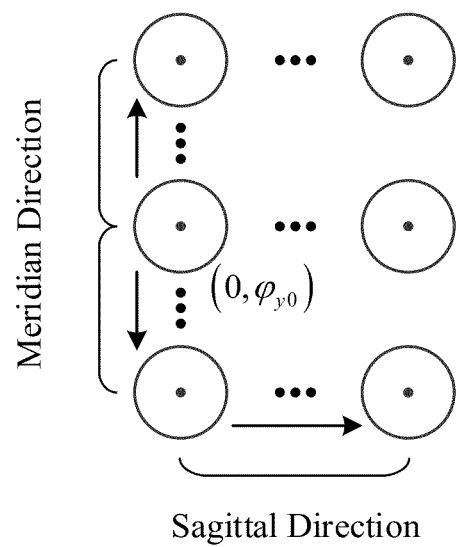
FIG. 4 is an expanding direction diagram of an embodiment of construction feature fields.

Referring to FIG. 4, the initial system comprises L initial surfaces, and the L initial surfaces are defined as $L_j$ (j=1, 2, ... L). Block (B2) comprises the steps of:

block (B21), selecting at least one field of the M feature fields $\varphi_i$ (i=1, 2, ... M) as the first construction feature field, and constructing an initial surface $L_1$ into a freeform surface $N_1$ in the first construction feature field;

block (B22), adding at least one feature field to expand the first construction feature field to obtain a second construction feature field, and constructing an initial surface $L_2$ into a freeform surface $N_2$ in the second construction feature field; and block (B23), in the same way as step (S22), expanding the construction feature field by adding at least one feature field each time to obtained an expanded construction feature field, and constructing an initial surface $L_j$ (j=3, ... L) into a freeform surface $N_j$ (j=3, ... L) in the expanded construction feature field, until the L initial surfaces are constructed into L freeform surfaces.

In block (B21), a method of constructing the initial surface $L_1$ into the freeform surface $N_1$ in the first construction feature field comprises: calculating a plurality of feature data points $P_i$ (i=1, 2 ... K) on the freeform surface $N_1$; and surface fitting the plurality of feature data points to obtain an equation of the freeform surface $N_1$.

A surface $\Omega$ is defined as the freeform surface $N_1$, a surface $\Omega'$ is defined as a surface located adjacent to and before the surface $\Omega$, and a surface $\Omega''$ is defined as a surface located adjacent to and after the surface $\Omega$. The intersections of the plurality of feature rays $R_i$ (i=1, 2 ... K) with the surface $\Omega$ are defined as the first feature data points $P_i$ (i=1, 2 ... K). The plurality of feature rays $R_i$ (i=1, 2 ... K) are intersected with the surface $\Omega'$ at a plurality of start points $S_i$ (i=1, 2 ... K), and intersected with the surface $\Omega''$ at a plurality of end points $E_i$ (i=1, 2 ... K). When the surface $\Omega$ and the plurality of feature rays $R_i$ (i=1, 2 ... K) are determined, the plurality of start points $S_i$ (i=1, 2 ... K) of the feature rays $R_i$ (i=1, 2 ... K) can also be determined. The plurality of end points $E_i$ (i=1, 2 ... K) can also be obtained based on the object-image relationship or given mapping relationship. Under ideal conditions, the feature rays $R_i$ (i=1, 2 ... K) emitted from the plurality of start points $S_i$ (i=1, 2 ... K) on the surface $\Omega'$; pass through the first feature data points $P_i$ (i=1, 2 ... K) on the surface $\Omega$; intersect with the surface $\Omega''$ at the plurality of end points $E_i$ (i=1, 2 ... K); and finally intersect with the image plane at the plurality of ideal target points $T_{i,ideal}$ (i=1, 2 ... K). If the surface $\Omega''$ is the target plane, the plurality of end points $E_i$ (i=1, 2 ... K) are the plurality of ideal target points $I_i$ (i=1, 2 ... K). If there are other surfaces between the surface $\Omega$ and the target plane, the plurality of end points $E_i$ (i=1, 2 ... K) are the points on the surface $\Omega''$, which make the first variation of the optical path length between the first feature data points $P_i$ (i=1, 2 ... K) and their corresponding target points zero. $\delta S = \delta \int_{P_i}^{T_i} n ds = 0$, wherein ds is the differential elements of the optical path length along the plurality of feature rays $R_i$ (i=1, 2 ... K), n denotes the refractive index of the medium, and $\delta$ denotes a differential variation.

A method of calculating the plurality of feature data points $P_i$ (i=1, 2 ... K) comprises:

block (a): defining a first intersection of a first feature light ray $R_1$ and the initial surface as a feature data point $P_1$;

block (b): when an ith (1≤i≤K−1) feature data point $P_i$ (1≤i≤K−1) has been obtained, a unit normal vector $\vec{N}_i$| at the ith (1≤i≤K−1) feature data point $P_i$ (1≤i≤K−1) can be calculated based on the vector form of Snell's law;

block (c): making a first tangent plane through the ith (1≤i≤K−1) feature data point $P_i$ (1≤i≤K−1), and (K−i) second intersections can be obtained by the first tangent plane intersecting with remaining (K−i) feature rays; a second intersection $Q_{i+1}$, which is nearest to the ith ($1 \le i \le K-1$) feature data point $P_i$ ($1 \le i \le K-1$), is fixed; and a feature ray corresponding to the second intersection $Q_{i+1}$ is defined as $R_{i+1}$, a shortest distance between the second intersection $Q_{i+1}$ and the ith feature data point $P_i$ ($1 \le i \le K-1$) is defined as $d_i$;

block (d): making a second tangent plane at (i−1) feature data points that are obtained before the ith feature data point $P_i$ ($1 \le i \le K-1$) respectively; thus, (i−1) second tangent planes can be obtained, and (i−1) third intersections can be obtained by the (i−1) second tangent planes intersecting with a feature ray $R_{i+1}$; in each of the (i−1) second tangent planes, each of the (i−1) third intersections and its corresponding feature data point form an intersection pair; the intersection pair, which has the shortest distance between a third intersection and its corresponding feature data point, is fixed; and the third intersection and the shortest distance is defined as $Q'_{i+1}$ and $d'_i$ respectively;

block (e): comparing $d_i$ and $d'_i$, if $d_i \le d'_i$, $Q_{i+1}$ is taken as the next feature data point $P_{i+1}$ ($1 \le i \le K-1$); otherwise, $Q'_{i+1}$ is taken as the next feature data point $P_{i+1}$ ($1 \le i \le K-1$); and block (f): repeating steps from (b') to (e'), until the plurality of feature data points $P_i$ (i=1, 2 . . . K) are all calculated.

In block (b), the unit normal vector $$\vec{N}_i$$

($1 \le i \le K-1$) at each of the feature data point $P_i$ ($1 \le i \le K-1$) can be calculated based on the vector form of Snell's Law. When the freeform surface $N_1$ is a refractive surface, $$\vec{N}_i = \frac{n'\vec{r}'_i - n\vec{r}_i}{|n'\vec{r}'_i - n\vec{r}_i|} \quad (1)$$

$$\vec{r}_i = \frac{\overrightarrow{P_i S_i}}{|\overrightarrow{P_i S_i}|}$$

is a unit vector along a direction of an incident ray for the freeform surface $N_1$;

$$\vec{r}'_i = \frac{\overrightarrow{E_i P_i}}{|\overrightarrow{E_i P_i}|}$$

is a unit vector along a direction for an exit ray of the first freeform surface; and n, n' is refractive index of a media before and after the freeform surface $N_1$ respectively.

Similarly, when the freeform surface $N_1$ is a reflective surface, $$\vec{N}_i = \frac{\vec{r}'_i - \vec{r}_i}{|\vec{r}'_i - \vec{r}_i|} \quad (2)$$

The unit normal vector $$\vec{N}_i$$

at each of the plurality of feature data points $P_i$ (i=1, 2 . . . K) is perpendicular to the first tangent plane at each of the plurality of feature data points $P_i$ (i=1, 2 . . . K). Thus, the first tangent plane at each of the plurality of feature data points $P_i$ (i=1, 2 . . . K) can be obtained.

In one embodiment, the space of the initial system is defined as a first three-dimensional rectangular coordinates system. The propagation direction of beams is defined as a Z-axis, and the Z-axis is perpendicular to an XOY plane.

A method of surface fitting the plurality of feature data points $P_i$ (i=1, 2 . . . K) comprises:

block (B211): surface fitting the plurality of feature data points $P_i$ (i=1, 2 . . . K) to a sphere in the first three-dimensional rectangular coordinates system, and obtaining a curvature c of the sphere and the center of curvature ($x_c$, $y_c$, $z_c$) corresponding to the curvature c of the sphere;

block (B212): defining the feature data point ($x_o$, $y_o$, $z_o$) corresponding to a chief ray of the central field angle among the entire field-of-view (FOV) as the vertex of the sphere, defining a second three-dimensional rectangular coordinates system by the vertex of the sphere as origin and a line passing through the center of curvature and the vertex of the sphere as a Z'-axis;

block (B213): transforming the coordinates ($x_i$, $y_i$, $z_i$) and the normal vector ($\alpha_i$, $\beta_i$, $\gamma_i$), of the plurality of feature data points $P_i$ (i=1, 2 . . . K) in the first three-dimensional rectangular coordinates system, into the coordinates ($x'_i$, $y'_i$, $z'_i$) and the normal vector ($\alpha'_i$, $\beta'_i$, $\gamma'_i$), of the plurality of feature data points $P_i$ (i=1, 2 . . . K) in the second three-dimensional rectangular coordinates system;

block (B214): fitting the plurality of feature data points $P_i$ (i=1, 2 . . . K) into a conic surface equation of a conic surface in the second three-dimensional rectangular coordinates system, based on the coordinates ($x'_i$, $y'_i$, $z'_i$) and the curvature c of the sphere, and obtaining the conic constant k; and block (B215): removing the coordinates and the normal vector of the plurality of first feature data points $P_i$ (i=1, 2 . . . K), on the conic surface in the second three-dimensional rectangular coordinates system, from the coordinates ($x'_i$, $y'_i$, $z'_i$) and the normal vector ($\alpha'_i$, $\beta'_i$, $\gamma'_i$), to obtain a residual coordinate and a residual normal vector; and fitting the residual coordinate and the residual normal vector to obtain a polynomial surface equation; the equation of the freeform surface $N_1$ can be obtained by adding the conic surface equation and the polynomial surface equation.

Generally, the imaging systems are symmetric about the YOZ plane. Therefore, the tilt angle θ of the sphere, in the Y'O'Z' plane of the second three-dimensional rectangular coordinates system relative to in the YOZ plane of the first three-dimensional rectangular coordinates system, is:

$$\theta = \arctan\left(\frac{y_o - y_c}{z_o - z_c}\right).$$

The relationship between the coordinates ($x'_i$, $y'_i$, $z'_i$) and the coordinates ($x_i$, $y_i$, $z_i$) of each of the plurality of feature data points $P_i$ (i=1, 2 . . . K) can be expressed as following:

$$\begin{cases} x'_i = x_i - x_o \\ y'_i = (y_i - y_o)\cos\theta - (z_i - z_o)\sin\theta \\ z'_i = (y_i - y_o)\sin\theta + (z_i - z_o)\cos\theta \end{cases}$$

The relationship between the normal vector ($\alpha'_i$, $\beta'_i$, $\gamma'_i$) and the normal vector ($\alpha_i$, $\beta_i$, $\gamma_i$) of each of the plurality of feature data points $P_i$ (i=1, 2 ... K) can be expressed as following:

$$\begin{cases} \alpha'_i = \alpha_i \\ \beta'_i = \beta_i\cos\theta - \gamma_i\sin\theta \\ \gamma'_i = \beta_i\sin\theta + \gamma_i\cos\theta \end{cases}$$

In the second three-dimensional rectangular coordinates system, the coordinates and the normal vector of the plurality of feature data points $P_i$ (i=1, 2 ... K) on the conic surface are defined as ($x'_i$, $y'_i$, $z'_{is}$) and ($\alpha'_{is}$, $\beta'_{is}$, $\gamma'_{is}$) respectively. The Z'-axis component of the normal vector is normalized to −1. The residual coordinate ($x''_i$, $y''_i$, $z''_i$) and the residual normal vector ($\alpha''_i$, $\beta''_i$, −1) can be obtained, wherein, $$(x''_i, y''_i, z''_i) = (x'_i, y'_i, z'_i - z'_{is}) \text{ and}$$

$$(\alpha''_i, \beta''_i, -1) = \left(-\frac{\alpha'_i}{\gamma'_i} + \frac{\alpha'_{is}}{\gamma'_{is}}, -\frac{\beta'_i}{\gamma'_i} + \frac{\beta'_{is}}{\gamma'_{is}}, -1\right).$$

In block (B215), a method of surface fitting the residual coordinate and the residual normal vector comprises:

in the second three-dimensional rectangular coordinates system, expressing a polynomial surface of the freeform surface off-axial three-mirror imaging system by the polynomial surface equation leaving out the conic surface term, the polynomial surface can be expressed in terms of the following equation:

$$z = f(x, y; P) = \sum_{j=1}^{J} P_j g_j(x, y),$$

wherein $g_j(x, y)$ is one item of the polynomial, and $P=(p_1, p_2,L,p_J)^T$ is the coefficient sets;

acquiring a first sum of squares $d_1(P)$, of residual coordinate differences in z' direction between the residual coordinate value ($x''_i$, $y''_i$, $z''_i$) (i=1, 2, ..., K) and the freeform surface; and a second sum of squares $d_2(P)$, of modulus of vector differences between the residual normal vector $N_i=(\alpha''_i, \beta''_i, -1)$ (i=1, 2, ..., K) and a normal vector of the freeform surface, wherein the first sum of squares $d_1(P)$ is expressed in terms of a first equation:

$$d_1(P) = \sum_{i=1}^{I}[z_i - f(x''_i, y''_i; P)]^2 = (Z - A_1P)^T(Z - A_1P),$$

and
the second sum of squares $d_2(P)$ is expressed in terms of a second equation:

$$d_2(P) = \sum_{i=1}^{I}\{[u_i - f_{x''}(x''_i, y''_i; P)]^2 + [v_i - f_{y''}(x''_i, y''_i; P)]^2\} =$$
$$(U - A_2P)^T(U - A_2P) + (V - A_3P)^T(V - A_3P)$$

wherein, $$Z = (z_1, z_2, L, z_I)^T,$$

$$U = (u_1, u_2, L, u_I)^T,$$

$$V = (v_1, v_2, L, v_I)^T,$$

$$A_1 = \begin{pmatrix} g_1(x''_1, y''_1) & g_2(x''_1, y''_1) & \cdots & g_J(x''_1, y''_1) \\ g_1(x''_2, y''_2) & g_2(x''_2, y''_2) & \cdots & g_J(x''_2, y''_2) \\ \vdots & \vdots & & \vdots \\ g_1(x''_I, y''_I) & g_2(x''_I, y''_I) & \cdots & g_J(x''_I, y''_I) \end{pmatrix},$$

$$A_2 = \begin{pmatrix} g_1^x(x''_1, y''_1) & g_2^x(x''_1, y''_1) & \cdots & g_J^x(x''_1, y''_1) \\ g_1^x(x''_2, y''_2) & g_2^x(x''_2, y''_2) & \cdots & g_J^x(x''_2, y''_2) \\ \vdots & \vdots & & \vdots \\ g_1^x(x''_I, y''_I) & g_2^x(x''_I, y''_I) & \cdots & g_J^x(x''_I, y''_I) \end{pmatrix},$$

$$A_3 = \begin{pmatrix} g_1^y(x''_1, y''_1) & g_2^y(x''_1, y''_1) & \cdots & g_J^y(x''_1, y''_1) \\ g_1^y(x''_2, y''_2) & g_2^y(x''_2, y''_2) & \cdots & g_J^y(x''_2, y''_2) \\ \vdots & \vdots & & \vdots \\ g_1^y(x''_I, y''_I) & g_2^y(x''_I, y''_I) & \cdots & g_J^y(x''_I, y''_I) \end{pmatrix};$$

obtaining an evaluation function, $$P=(A_1^TA_1+wA_2^TA_2+wA_3^TA_3)^{-1}\cdot(A_1^TZ+wA_2^TU+wA_3^TV),$$

wherein w is a weighting greater than 0;

selecting different weightings w and setting a gradient $\Delta f(P)$ of the evaluation function equal to 0, to obtain a plurality of different values of P and a plurality of freeform surface shapes z=f (x, y; P) corresponding to each of the plurality of different values of P; and choosing a final freeform surface shape $\Omega_{opt}$ which has a best imaging quality from the plurality of freeform surface shapes z=f (x, y; P).

The methods of constructing other initial surfaces of the initial system into the freeform surfaces are substantially the same as the method of constructing the freeform surface $N_1$, except that the construction feature fields are different. Methods of calculating the feature data points on other freeform surfaces are the same as the method of calculating the feature data points on freeform surface $N_1$. Methods of surface fitting the plurality of feature data points on other freeform surfaces are the same as the method of fitting the plurality of feature data points on the freeform surface $N_1$.

In one embodiment, in block (B21), selecting one field of the M feature fields $\varphi_i$ (i=1, 2, ... M) as the first construction feature field; and in block (B22) and block (B23), expanding the construction feature field by adding one feature field each time to obtained the expanded construction feature field.

Figure 5:
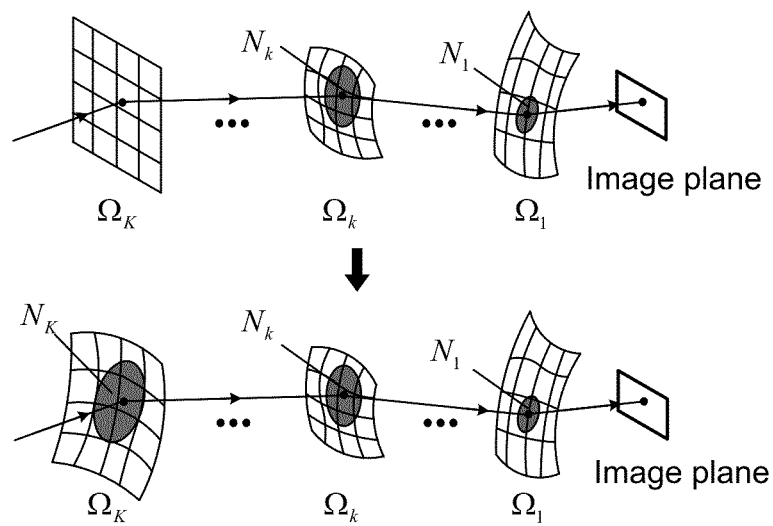
FIG. 5 is a diagram of an embodiment of expanding the construction feature field and constructing the initial system into a freeform surface system.

Referring to FIG. 5, block (B3) comprises:

block (B31), adding at least one feature field to extend the expanded construction feature field in block (B23) to obtain an construction feature field "I", and constructing the freeform surface $N_1$ into a freeform surface $N'_1$ in the construction feature field "I";

block (B32), adding at least one feature field to extend the construction feature field "I" to obtain a construction feature field "II", and constructing the freeform surface $N_2$ into a freeform surface $N'_2$ in the construction feature field "II";

block (B33), in the same way as block (B32), extending the construction feature field by adding at least one feature field each time to obtained an extended construction feature field, and constructing L freeform surfaces in the freeform surface system into L new freeform surfaces; and repeating this step until the M feature fields are used up; and block (B34), at least one feature field of the M feature fields is not used on at least one freeform surface, and reconstructing the at least one freeform surface using the M feature fields.

Figure 6:
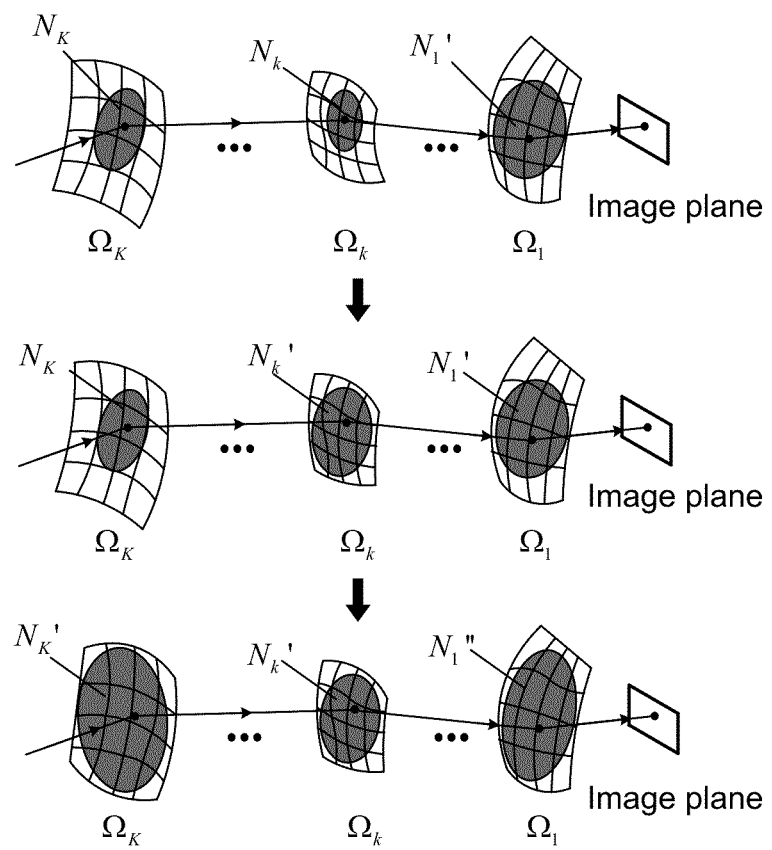
FIG. 6 is a diagram of an embodiment of extending a construction area and reconstructing freeform surfaces of the freeform surface system.

Referring to FIG. 6, in one embodiment, when the freeform surface $N_k$ in the freeform surface system is reconstructed into a freeform surface $N'_k$, the M feature fields are used up; and other freeform surfaces except the freeform surface $N'_k$ are reconstructed using all the M feature fields.

In block (B31), the intersections of the feature light rays in the construction feature field "I" and the freeform surface $N_1$ can be obtained by Snell's law and object image relationship. The intersections are the feature data points on the freeform surface $N'_1$. Solving a normal vector at each feature data point based on the object image relationship, and surface fitting the plurality of feature data points to obtain an equation of the freeform surface $N'_1$. A method of surface fitting the plurality of feature data points to obtain the equation of the freeform surface $N'_1$ is the same as the method of fitting the plurality of feature data points $P_i$ (i=1, 2 ... K) to obtain the equation of the freeform surface $N_1$ in block (B2).

In one embodiment, extending the construction feature field by adding one feature field each time to obtained the extended construction feature field. Block (B3) comprises: block (B31), adding a feature field $\varphi_{L+1}$, and constructing the freeform surface $N_1$ into a freeform surface $N'_1$ in the feature fields ($\varphi_1, \varphi_1 \ldots \varphi_{L+1}$); block (B32), adding a feature field $\varphi_{L+2}$, and constructing the freeform surface $N_2$ into a freeform surface $N'_2$ in the feature fields ($\varphi_1, \varphi_1 \ldots \varphi_{L+2}$); and block (B32), in the same way as block (B32), extending the construction feature field by adding one feature field each time to obtained an extended construction feature field, and constructing L freeform surfaces in the freeform surface system into L new freeform surfaces, until the M feature fields are used up.

Furthermore, a step of optimizing the freeform surface off-axial three-mirror imaging system obtained in block (B3) by using the freeform surface off-axial three-mirror imaging systems as an initial system of optimization can be performed.

In one embodiment, after block (B3), further comprises enlarge the freeform surface off-axis imaging system by a certain multiple.

In one embodiment, after the freeform surface off-axial three-mirror imaging system is designed, further manufacturing the freeform surface off-axial three-mirror imaging system.

Figure 7:
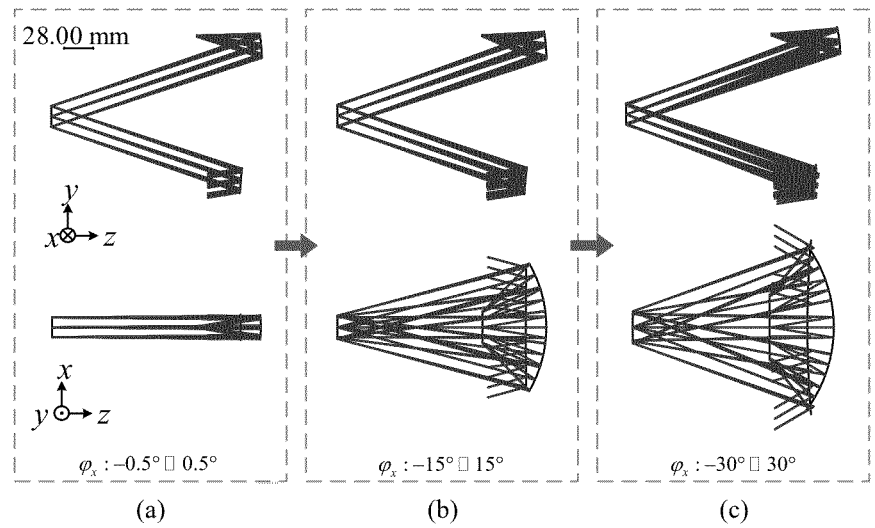
FIG. 7 is a diagram of an embodiment of a construction process of a freeform surface off-axis three-mirror imaging system.

Referring to FIG. 7, in one embodiment, constructing a tertiary mirror in the feature field $\varphi_1 = 0.5°$; adding the construction feature field and constructing a secondary mirror and a primary mirror in turn; after the tertiary mirror, the secondary mirror, and the primary mirror are constructed, a freeform surface extension process is performed, and a reconstruction sequence of the extension process is the tertiary mirror, the secondary mirror, and the primary mirror in turn.

Freeform surface off-axial imaging systems with large relative aperture and wide field can be obtained by the above method of designing the freeform surface off-axial three-mirror imaging system. Furthermore, an aberration compensation for the constructed feature field can be performed in the process of expanding the construction feature field, and thus an image quality of the freeform surface off-axial three-mirror imaging system is improved.

Figure 8:
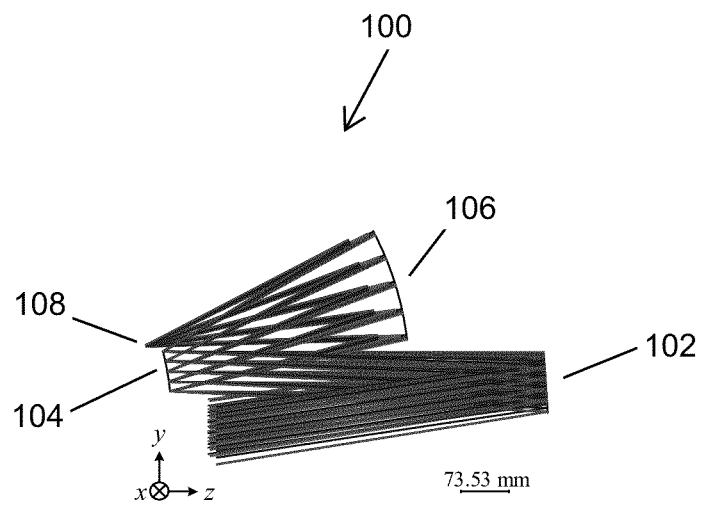
FIG. 8 is a light path schematic view of an embodiment of a freeform surface off-axis three-mirror imaging system.

Referring to FIG. 8, a freeform surface off-axial three-mirror imaging system 100 is designed with the above method to prove the above method. The freeform surface off-axial three-mirror imaging system 100 comprises a primary mirror 102, a secondary mirror 104, and a tertiary mirror 106 adjacent and spaced from each other. The secondary mirror 104 is used as a stop surface. A surface shape of each of the primary mirror 102, the secondary mirror 104, and the tertiary mirror 106 is a freeform surface. The feature rays exiting from the light source would be successively reflected by the primary mirror 102, the secondary mirror 104 and the tertiary mirror 106 to form an image on an image sensor 108.

A first three-dimensional rectangular coordinates system (X,Y,Z) is defined by a location of the primary mirror 102; a second three-dimensional rectangular coordinates system (X',Y',Z') is defined by a location of the secondary mirror 104; and a third three-dimensional rectangular coordinates system (X",Y",Z") is defined by a location of the tertiary mirror 106.

A vertex of the primary mirror 102 is an origin of the first three-dimensional rectangular coordinates system (X,Y,Z). A horizontal line passing through the vertex of the primary mirror 102 is defined as a Z-axis; in the Z-axis, to the left is negative, and to the right is positive. A Y-axis is substantially perpendicular to the Z-axis and in a plane shown in FIG. 8; in the Y-axis, to the upward is positive, and to the downward is negative. An X-axis is substantially perpendicular to a YZ plane; in the X-axis, to the inside is positive, and to the outside is negative.

A reflective surface of the primary mirror 102 in the first three-dimensional rectangular coordinates system (X,Y,Z) is an xy polynomial freeform surface; and an xy polynomial equation can be expressed as follows:

$$z(x, y) = \frac{c(x^2 + y^2)}{1 + \sqrt{1 - (1+k)c^2(x^2 + y^2)}} + \sum_{i=1}^{N} A_i x^m y^n.$$

In the xy polynomial equation, z represents surface sag, c represents surface curvature, k represents conic constant, while $A_i$ represents the ith term coefficient. Since the freeform surface off-axial three-mirror imaging system 100 is symmetrical about a YOZ plane, so even order terms of x can be only remained. At the same time, higher order terms will increase the fabrication difficulty of the off-axial three-mirror optical system with freeform surfaces 100. In one embodiment, the reflective surface of the primary mirror 102 is an eighth-order polynomial freeform surface of xy without odd items of x; and an equation of the eighth-order polynomial freeform surface of xy can be expressed as follows:

$$z(x, y) = \frac{c(x^2 + y^2)}{1 + \sqrt{1 - (1+k)c^2(x^2 + y^2)}} + A_2 y + A_3 x^2 + A_5 y^2 + A_7 x^2 y +$$
$$A_9 y^3 + A_{10} x^4 + A_{12} x^2 y^2 + A_{14} y^4 + A_{16} x^4 y + A_{18} x^2 y^3 + A_{20} y^5 +$$

-continued $$A_{21}x^6 + A_{23}x^4y^2 + A_{25}x^2y^4 + A_{27}y^6 + A_{29}x^6y + A_{31}x^4y^3 +$$
$$A_{33}x^2y^5 + A_{35}y^7 + A_{36}y^8 + A_{38}x^6y^2 + A_{40}x^4y^4 + A_{42}x^2y^6.$$

In one embodiment, the values of c, k, and $A_i$ in the equation of the eighth-order polynomial freeform surface of xy of the reflective surface of the primary mirror 102 are listed in TABLE 1. However, the values of c, k, and $A_i$ in the eighth order xy polynomial equation are not limited to TABLE 1.

TABLE 1

| | |
|---|---|
| c | 2.0905292558E−03 |
| k | −1.21892397257173 |
| $A_2$ | −7.4132168689E−01 |
| $A_3$ | −1.0489399277E−03 |
| $A_5$ | −1.0932187535E−03 |
| $A_7$ | 1.8886774078E−07 |
| $A_9$ | 3.9367755612E−08 |
| $A_{10}$ | 1.8215989925E−10 |
| $A_{12}$ | 2.0074956485E−10 |
| $A_{14}$ | 3.4948173329E−09 |
| $A_{16}$ | −1.5663370553E−13 |
| $A_{18}$ | −2.3270934790E−13 |
| $A_{20}$ | −4.1540232365E−11 |
| $A_{21}$ | −7.5480347775E−17 |
| $A_{23}$ | 4.3918989072E−16 |
| $A_{25}$ | −8.2899003141E−15 |
| $A_{27}$ | 1.7435762237E−13 |
| $A_{29}$ | 1.3339713122E−19 |
| $A_{31}$ | 3.0368239305E−18 |
| $A_{33}$ | 8.0061751667E−18 |
| $A_{35}$ | −4.7950132667E−17 |
| $A_{36}$ | 5.1808677261E−23 |
| $A_{40}$ | −1.2808456638E−20 |
| $A_{42}$ | 6.5955002284E−19 |

A vertex of the secondary mirror 104 is an origin of the second three-dimensional rectangular coordinates system (X',Y',Z'). The second three-dimensional rectangular coordinates system (X',Y',Z') is obtained by moving the first three-dimensional rectangular coordinates system (X,Y,Z) along a Z-axis negative direction and a Y-axis negative direction. In one embodiment, The second three-dimensional rectangular coordinates system (X',Y',Z') is obtained by moving the first three-dimensional rectangular coordinates system (X,Y,Z) for about 272.306 mm along a Y-axis negative direction, and then moving for about 518.025 mm along a Z-axis negative direction, and then rotating along the counterclockwise direction for about 31.253° with the X axis as the rotation axis. A distance between the origin of the first three-dimensional rectangular coordinates system (X,Y, Z) and the origin of the second three-dimensional rectangular coordinates system (X',Y',Z') is about 585.235 mm.

In the second three-dimensional rectangular coordinates system (X',Y',Z'), a reflective surface of the secondary mirror is an x'y' polynomial freeform surface. An x'y' polynomial surface equation can be expressed as follows:

$$z'(x', y') = \frac{c'(x'^2 + y'^2)}{1 + \sqrt{1 - (1+k')c'^2(x'^2 + y'^2)}} + \sum_{i=1}^{N} A_i' x'^m y'^n$$

In the x'y' polynomial freeform surface equation, z' represents surface sag, c' represents surface curvature, k' represents conic constant, while $A_i'$ represents the ith term coefficient. Since the freeform surface off-axial three-mirror imaging system 100 is symmetrical about Y'Z' plane, so even-order terms of x' can be only remained. At the same time, higher order terms will increase the fabrication difficulty of the freeform surface off-axial three-mirror imaging system 100. In one embodiment, the reflective surface of the secondary mirror is an eighth-order polynomial freeform surface of x'y' without odd items of x'. An equation of the eighth-order polynomial freeform surface of x'y' can be expressed as follows:

$$z'(x', y') =$$
$$\frac{c'(x'^2 + y'^2)}{1 + \sqrt{1 - (1+k')c'^2(x'^2 + y'^2)}} + A_2'y' + A_3'x'^2 + A_5'y'^2 + A_7'x'^2y' +$$
$$A_9'y'^3 + A_{10}'x'^4 + A_{12}'x'^2y'^2 + A_{14}'y'^4 + A_{16}'x'^4y + A_{18}'x'^2y'^3 + A_{20}'y'^5 +$$
$$A_{21}'x'^6 + A_{23}'x'^4y'^2 + A_{25}'x'^2y'^4 + A_{27}'y'^6 + A_{29}'x'^6y' + A_{31}'x'^4y'^3 +$$
$$A_{33}'x'^2y'^5 + A_{35}'y'^7 + A_{36}'x'^8 + A_{38}'x'^6y'^2 + A_{40}'x'^4y'^4 + A_{42}'x'^2y'^6$$

In one embodiment, the values of c', k', and $A_i'$ in the equation of the eighth-order polynomial freeform surface of x'y' are listed in TABLE 2. However, the values of c', k', and $A_i'$ in the equation of the eighth-order polynomial freeform surface of x'y' are not limited to TABLE 2.

TABLE 2

| | |
|---|---|
| c' | 1.2419254309E−03 |
| k' | 11.4470143760146 |
| $A_2'$ | 2.6039347329E−01 |
| $A_3'$ | −1.5571495307E−03 |
| $A_5'$ | −1.8499719195E−03 |
| $A_7'$ | 3.1123110562E−07 |
| $A_9'$ | −7.2750566448E−08 |
| $A_{10}'$ | −1.0565839855E−08 |
| $A_{12}'$ | −2.4835983560E−08 |
| $A_{14}'$ | −1.6584532798E−08 |
| $A_{16}'$ | −2.1393403767E−12 |
| $A_{18}'$ | −1.6810005234E−12 |
| $A_{20}'$ | −1.3947835440E−11 |
| $A_{21}'$ | −3.1895103407E−14 |
| $A_{23}'$ | −8.4530987667E−13 |
| $A_{25}'$ | −4.1377307296E−13 |
| $A_{27}'$ | 8.5456614986E−14 |
| $A_{29}'$ | 9.6174103349E−15 |
| $A_{31}'$ | −7.1427426063E−15 |
| $A_{33}'$ | −3.1310574623E−15 |
| $A_{35}'$ | 2.8784215520E−15 |
| $A_{36}'$ | −6.8582114820E−17 |
| $A_{40}'$ | −1.5699572247E−15 |
| $A_{42}'$ | 6.5300451569E−17 |

A vertex of the tertiary mirror 106 is an origin of the third three-dimensional rectangular coordinates system (X",Y", Z"). The third three-dimensional rectangular coordinates system (X",Y",Z") is obtained by moving the second three-dimensional rectangular coordinates system (X',Y',Z') along a Z'-axis positive direction and a Y'-axis positive direction. In one embodiment, the third three-dimensional rectangular coordinates system (X",Y",Z") is obtained by moving the second three-dimensional rectangular coordinates system (X',Y',Z') for about 346.467 mm along a Z'-axis negative direction, and then moving for about 141.540 mm along a Y'-axis negative direction, and then rotating along the counterclockwise direction for about 20.079° with the X'-axis s as the rotation axis. A distance between the origin of the third three-dimensional rectangular coordinates system (X",Y", Z") and the origin of the second three-dimensional rectangular coordinates system (X',Y',Z') is about 374.263 mm.

In the third three-dimensional rectangular coordinates system (X',Y',Z'), a reflective surface of the tertiary mirror 106 is an x"y" polynomial freeform surface. An x"y" polynomial surface equation can be expressed as follows:

$$z''(x'', y'') = \frac{c''(x''^2 + y''^2)}{1 + \sqrt{1 - (1+k'')c''^2(x''^2 + y''^2)}} + \sum_{i=1}^{N} A_i'' x''^m y''^n.$$

In the x"y" polynomial freeform surface equation, z" represents surface sag, c" represents surface curvature, k" represents conic constant, while $A_i''$ represents the ith term coefficient. Since the freeform surface off-axial three-mirror imaging system 100 is symmetrical about Y"Z" plane, so even-order terms of x" can be only remained. At the same time, higher order terms will increase the fabrication difficulty of the freeform surface off-axial three-mirror imaging system 100. In one embodiment, the reflective surface of the tertiary mirror 106 is an eighth-order polynomial freeform surface of x"y" without odd items of x". An equation of the eighth-order polynomial freeform surface of x"y" can be expressed as follows:

$$z''(x'', y'') = \frac{c''(x''^2 + y''^2)}{1 + \sqrt{1 - (1+k'')c''^2(x''^2 + y''^2)}} + A_2'' y'' + A_3'' x''^2 +$$
$$A_5'' y''^2 + A_7'' x''^2 y'' + A_9'' y''^3 + A_{10}'' x''^4 + A_{12}'' x''^2 y''^2 + A_{14}'' y''^4 +$$
$$A_{16}'' x''^4 y'' + A_{18}'' x''^2 y''^3 + A_{20}'' y''^5 + A_{21}'' x''^6 + A_{23}'' x''^4 y''^2 +$$
$$A_{25}'' x''^2 y''^4 + A_{27}'' y''^6 + A_{29}'' x''^6 y'' + A_{31}'' x''^4 y''^3 + A_{33}'' x''^2 y''^5 +$$
$$A_{35}'' y''^7 + A_{36}'' y''^8 + A_{38}'' x''^6 y''^2 + A_{40}'' x''^4 y''^4 + A_{42}'' x''^2 y''^6.$$

In one embodiment, the values of c", k", and $A_i''$ in the eighth order x"y" polynomial surface equation are listed in TABLE 3. However, the values of c", k", and $A_i''$ in the eighth order x"y" polynomial surface equation are not limited to TABLE 3.

TABLE 3

| | |
|---|---|
| c" | −2.3117990132E−03 |
| k" | −9.0353982823E−02 |
| $A_2''$ | 2.3151773248E−02 |
| $A_3''$ | 1.3411119803E−04 |
| $A_5''$ | 9.7954301258E−05 |
| $A_7''$ | 4.0553954355E−08 |
| $A_9''$ | 2.1746460869E−08 |
| $A_{10}''$ | 1.6438448222E−10 |
| $A_{12}''$ | 2.2410934162E−10 |
| $A_{14}''$ | 4.5429699280E−11 |
| $A_{16}''$ | 1.1872420633E−13 |
| $A_{18}''$ | 1.5798764234E−13 |
| $A_{20}''$ | 1.3425352595E−14 |
| $A_{21}''$ | 3.1961386864E−16 |
| $A_{23}''$ | 8.2640583723E−16 |
| $A_{25}''$ | 5.0212511084E−17 |
| $A_{27}''$ | 1.5492827151E−16 |
| $A_{29}''$ | 7.1429537548E−19 |
| $A_{31}''$ | 1.1507858347E−18 |
| $A_{33}''$ | −6.5780484704E−19 |
| $A_{35}''$ | 4.2158929949E−18 |
| $A_{36}''$ | 7.6045895800E−22 |
| $A_{40}''$ | −1.0675040865E−22 |
| $A_{42}''$ | 2.0087308226E−20 |

The materials of the primary mirror 102, the secondary mirror 104 and the tertiary mirror 106 can be aluminum, beryllium or other metals. The materials of the primary mirror 102, the secondary mirror 104 and the tertiary mirror 106 can also be silicon carbide, quartz or other inorganic materials. A reflection enhancing coating can also be coated on the metals or inorganic materials to enhance the reflectivity performance of the three mirrors. In one embodiment, the reflection enhancing coating is a gold film. A size of each of the primary mirror 102, the secondary mirror 104 and the tertiary mirror 106 can be designed according to actual needs.

In the first three-dimensional rectangular coordinates system (X,Y,Z), a distance along the Z-axis negative direction between a center of the image sensor 108 and the vertex of the tertiary mirror 106 is about 391.895 mm. The center of the image sensor 108 deviates from the Z axis in the positive direction of the Y axis, and a deviation is about 33.491 mm. An angle of the image sensor 108 with the XY plane in the clockwise direction is about 7.435°. A size of the image sensor 108 can be selected according to actual needs. In one embodiment, the size of the image sensor 108 is 5 μm×5 μm.

An effective entrance pupil diameter of the freeform surface off-axial three-mirror imaging system 100 is about 60 mm.

The freeform surface off-axial three-mirror imaging system 100 adopts an off-axis field in meridian direction. A field angle of the freeform surface off-axial three-mirror imaging system 100 is larger than or equal to 60°×1°. In one embodiment, the field angle of the freeform surface off-axial three-mirror imaging system 100 is about 60°×1°, an angle along the sagittal direction is from about −30° to about 30°, and an angle along the meridian direction is from about 8° to about −9°.

A wavelength of the freeform surface off-axial three-mirror imaging system 100 is not limited, in one embodiment, the wavelength of the freeform surface off-axial three-mirror imaging system 100 is from about 380 nm to about 780 nm.

An effective focal length (EFL) of the freeform surface off-axial three-mirror imaging system 100 is about 150 mm.

An F-number of the freeform surface off-axial three-mirror imaging system 100 is less than or equal to 2.5. A relative aperture(D/f) is the reciprocal of the F-number. In one embodiment, the F-number is 2.5, and the relative aperture(D/f) is 0.4.

Figure 9:
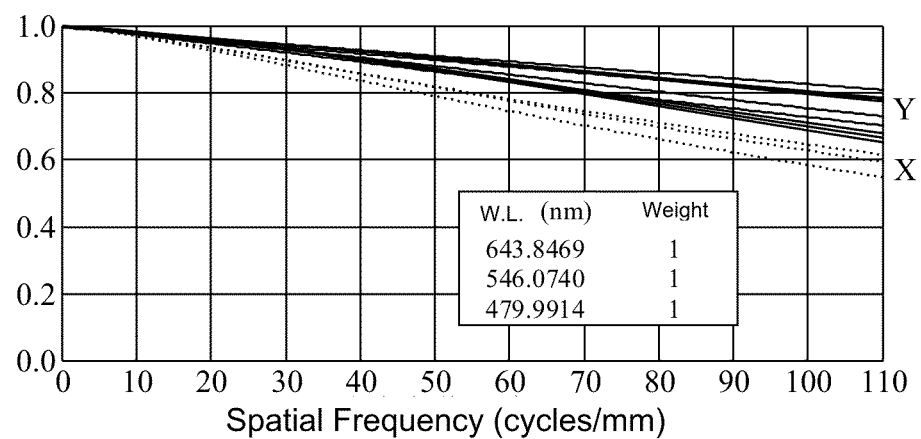
FIG. 9 shows modulation transfer functions (MTF) of the freeform surface off-axial three-mirror imaging system in FIG. 8.

Referring to FIG. 9, a modulation transfer functions (MTF) of the freeform surface off-axial three-mirror imaging system 100 in visible band of partial field angles are close to the diffraction limit. It shows that an imaging quality of the freeform surface off-axial three-mirror imaging system 100 is high.

Figure 10:
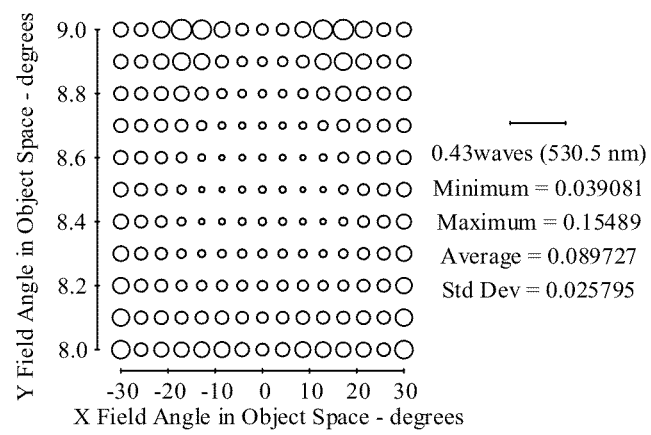
FIG. 10 shows an average wave aberration of the freeform surface off-axial three-mirror imaging system in FIG. 8.

Referring to FIG. 10, an average wave aberration of the freeform surface off-axial three-mirror imaging system 100 is 0.089λ, λ=530.5 nm. It shows that an imaging quality of the freeform surface off-axial three-mirror imaging system 100 is high.

Figure 11:
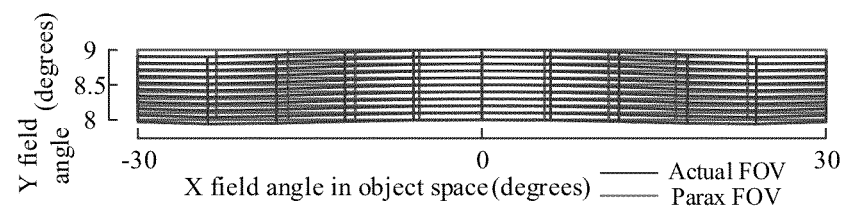
FIG. 11 shows a relative distortion diagram of the freeform surface off-axis three-mirror imaging system in FIG. 8.

Referring to FIG. 11, it can be seen that a maximum relative distortion of the freeform surface off-axial three-mirror imaging system 100 is 8.1%. The freeform surface off-axial three-mirror imaging system 100 has small relative distortion compared to other free-form off-axis three-reverse imaging systems with large field angles. It shows that an imaging error is small and the image quality is high.

Since the freeform surface off-axial three-mirror imaging system 100 has no center block, the freeform surface off-axial three-mirror imaging system 100 can achieve a large field angle and a large imaging range, the field angle is about 60°×1°. The F-number of the freeform surface off-axial three-mirror imaging system 100 is 2.5, high resolution images can be obtained by the freeform surface off-axial three-mirror imaging system 100. A structure of the freeform surface off-axial three-mirror imaging system 100 is compact.

The applications of the freeform surface off-axial three-mirror imaging system 100 comprises earth observation, space target detection, astronomical observations, Multispectral thermal imaging, and dimensional mapping. The freeform surface off-axial three-mirror imaging system 100 can be used in the visible band or the infrared band.

Depending on the embodiment, certain blocks/steps of the methods described may be removed, others may be added, and the sequence of blocks may be altered. It is also to be understood that the description and the claims drawn to a method may comprise some indication in reference to certain blocks/steps. However, the indication used is only to be viewed for identification purposes and not as a suggestion as to an order for the blocks/steps.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A freeform surface off-axial three-mirror imaging system, comprising:
a primary mirror, a secondary mirror, a tertiary mirror, and an image sensor, wherein a plurality of feature rays are successively reflected by the primary mirror, the secondary mirror and the tertiary mirror to form an image on the image sensor;
a first three-dimensional rectangular coordinates system (X,Y,Z) is defined with a vertex of the primary mirror as a first origin, and in the first three-dimensional rectangular coordinates system (X,Y,Z), a reflective surface of the primary mirror is an xy polynomial freeform surface;
a second three-dimensional rectangular coordinates system (X',Y',Z') is defined with a vertex of the secondary mirror as a second origin, and the second three-dimensional rectangular coordinates system (X',Y',Z') is obtained by moving the first three-dimensional rectangular coordinates system (X,Y,Z) along a Z-axis negative direction and a Y-axis negative direction, and in the second three-dimensional rectangular coordinates system (X',Y',Z'), a reflective surface of the secondary mirror is an x'y' polynomial freeform surface;
a third three-dimensional rectangular coordinates system (X",Y",Z") is defined with a vertex of the tertiary mirror as a third origin, and the third three-dimensional rectangular coordinates system (X",Y",Z") is obtained by moving the second three-dimensional rectangular coordinates system (X',Y',Z') along a Z'-axis positive direction and a Y'-axis positive direction, and in the third three-dimensional rectangular coordinates system (X",Y",Z"), a reflective surface of the tertiary mirror is an x"y" polynomial freeform surface;
a field angle of the freeform surface off-axial three-mirror imaging system is larger than or equal to 60°×1°, and an F-number of the freeform surface off-axial three-mirror imaging system is less than or equal to 2.5.

2. The freeform surface off-axial three-mirror imaging system of claim 1, wherein the second three-dimensional rectangular coordinates system (X',Y',Z') is obtained by a process of: moving the first three-dimensional rectangular coordinates system (X,Y,Z) for about 272.306 mm along the Y-axis negative direction, and then moving for about 518.025 mm along the Z-axis negative direction, and then rotating along a counterclockwise direction for about 31.253° with an X-axis as a rotation axis.

3. The freeform surface off-axial three-mirror imaging system of claim 1, wherein the third three-dimensional rectangular coordinates system (X",Y",Z") is obtained by a process of: moving the second three-dimensional rectangular coordinates system (X',Y',Z') for about 346.467 mm along the Z'-axis negative direction, and then moving for about 141.540 mm along the Y'-axis negative direction, and then rotating along a counterclockwise direction for about 20.079° with an X'-axis as the rotation axis.

4. The freeform surface off-axial three-mirror imaging system of claim 1, wherein a distance between the first origin and the second origin is about 585.235 mm.

5. The freeform surface off-axial three-mirror imaging system of claim 1, wherein a distance between the second origin and the third origin is about 374.263 mm.

6. The freeform surface off-axial three-mirror imaging system of claim 1, wherein in the first three-dimensional rectangular coordinates system (X,Y,Z), the reflective surface of the primary mirror is an eighth-order polynomial freeform surface of xy; and an equation of the eighth-order polynomial freeform surface of xy is:

$$z(x,y) = \frac{c(x^2+y^2)}{1+\sqrt{1-(1+k)c^2(x^2+y^2)}} + A_2 y + A_3 x^2 + A_5 y^2 + A_7 x^2 y +$$
$$A_9 y^3 + A_{10} x^4 + A_{12} x^2 y^2 + A_{14} y^4 + A_{16} x^4 y + A_{18} x^2 y^3 + A_{20} y^5 +$$
$$A_{21} x^6 + A_{23} x^4 y^2 + A_{25} x^2 y^4 + A_{27} y^6 + A_{29} x^6 y + A_{31} x^4 y^3 +$$
$$A_{33} x^2 y^5 + A_{35} y^7 + A_{36} y^8 + A_{38} x^6 y^2 + A_{40} x^4 y^4 + A_{42} x^2 y^6,$$

wherein z represents surface sag, c represents surface curvature, k represents conic constant, and $A_i$ represents the ith term coefficient.

7. The freeform surface off-axial three-mirror imaging system of claim 6, wherein

--- c = 2.0905292558E−03, k = −1.21892397257173,
$A_2$ = −7.4132168689E−01, $A_3$ = −1.0489399277E−03,
$A_5$ = −1.0932187535E−03, $A_7$ = 1.8886774078E−07,
$A_9$ = 3.9367755612E−08, $A_{10}$ = 1.8215989925E−10,
$A_{12}$ = 2.0074956485E−10, $A_{14}$ = 3.4948173329E−09,
$A_{16}$ = −1.5663370553E−13, $A_{18}$ = −2.3270934790E−13,
$A_{20}$ = −4.1540232365E−11, $A_{21}$ = −7.5480347775E−17,
$A_{23}$ = 4.3918989072E−16, $A_{25}$ = −8.2899003141E−15,
$A_{27}$ = 1.7435762237E−13, $A_{29}$ = 1.3339713122E−19,
$A_{31}$ = 3.0368239305E−18, $A_{33}$ = 8.0061751667E−18,
$A_{35}$ = −4.7950132667E−17, $A_{36}$ = 5.1808677261E−23,
$A_{40}$ = −1.2808456638E−20, and $A_{42}$ = 6.5955002284E−19.

---

8. The freeform surface off-axial three-mirror imaging system of claim 1, wherein in the second three-dimensional rectangular coordinates system (X',Y',Z'), the reflective surface of the secondary mirror is an eighth-order polynomial freeform surface of x'y' without odd items of x', and an equation of the eighth-order polynomial freeform surface of x'y' is:

$$z'(x', y') = \frac{c'(x'^2 + y'^2)}{1 + \sqrt{1 - (1+k')c'^2(x'^2 + y'^2)}} + A_2'y' + A_3'x'^2 + A_5'y'^2 + A_7'x'^2y' +$$
$$A_9'y'^3 + A_{10}'x'^4 + A_{12}'x'^2y'^2 + A_{14}'y'^4 + A_{16}'x'^4y' + A_{18}'x'^2y'^3 + A_{20}'y'^5 +$$
$$A_{21}'x'^6 + A_{23}'x'^4y'^2 + A_{25}'x'^2y'^4 + A_{27}'y'^6 + A_{29}'x'^6y' + A_{31}'x'^4y'^3 +$$
$$A_{33}'x'^2y'^5 + A_{35}'y'^7 + A_{36}'y'^8 + A_{38}'x'^6y'^2 + A_{40}'x'^4y'^4 + A_{42}'x'^2y'^6,$$

wherein z' represents surface sag, c' represents surface curvature, k' represents conic constant, and $A_i'$ represents the ith term coefficient.

9. The freeform surface off-axial three-mirror imaging system of claim 8, wherein

--- c' = 1.2419254309E−03, k' = 11.4470143760146,
$A_2'$ = 2.6039347329E−01, $A_3'$ = −1.5571495307E−03,
$A_5'$ = −1.8499719195E−03, $A_7'$ = 3.1123110562E−07,
$A_9'$ = −7.2750566448E−08, $A_{10}'$ = −1.0565839855E−08,
$A_{12}'$ = −2.4835983560E−08, $A_{14}'$ = −1.6584532798E−08,
$A_{16}'$ = −2.1393403767E−12, $A_{18}'$ = −1.6810005234E−12,
$A_{20}'$ = −1.3947835440E−11, $A_{21}'$ = −3.1895103407E−14,
$A_{23}'$ = −8.4530987667E−13, $A_{25}'$ = −4.1377307296E−13,
$A_{27}'$ = 8.5456614986E−14, $A_{29}'$ = 9.6174103349E−15,
$A_{31}'$ = −7.1427426063E−15, $A_{33}'$ = −3.1310574623E−15,
$A_{35}'$ = 2.8784215520E−15, $A_{36}'$ = 6.8582114820E−17,
$A_{40}'$ = −1.5699572247E−15, and $A_{42}'$ = 6.5300451569E−17.

---

10. The freeform surface off-axial three-mirror imaging system of claim 1, wherein in the third three-dimensional rectangular coordinates system (X",Y",Z"), the reflective surface of the tertiary mirror is an eighth-order polynomial freeform surface of x"y" without odd items of x", and an equation of the eighth-order polynomial freeform surface of x"y" is $$z''(x'', y'') = \frac{c''(x''^2 + y''^2)}{1 + \sqrt{1 - (1+k'')c''^2(x''^2 + y''^2)}} + A_2''y'' + A_3''x''^2 +$$
$$A_5''y''^2 + A_7''x''^2y'' + A_9''y''^3 + A_{10}''x''^4 + A_{12}''x''^2y''^2 + A_{14}''y''^4 +$$
$$A_{16}''x''^4y'' + A_{18}''x''^2y''^3 + A_{20}''y''^5 + A_{21}''x''^6 + A_{23}''x''^4y''^2 +$$
$$A_{25}''x''^2y''^4 + A_{27}''y''^6 + A_{29}''x''^6y'' + A_{31}''x''^4y''^3 + A_{33}''x''^2y''^5 +$$
$$A_{35}''y''^7 + A_{36}''y''^8 + A_{38}''x''^6y''^2 + A_{40}''x''^4y''^4 + A_{42}''x''^2y''^6,$$

wherein z" represents surface sag, c" represents surface curvature, k" represents conic constant, and $A_i''$ represents the ith term coefficient.

11. The freeform surface off-axial three-mirror imaging system of claim 10, wherein

--- c" = −2.3117990132E−03, k" = −9.0353982823E−02,
$A_2''$ = 2.3151773248E−02, $A_3''$ = 1.3411119803E−04,
$A_5''$ = 9.7954301258E−05, $A_7''$ = 4.0553954355E−08,
$A_9''$ = 2.1746460869E−08, $A_{10}''$ = 1.6438448222E−10,
$A_{12}''$ = 2.2410934162E−10, $A_{14}''$ = 4.5429699280E−11,
$A_{16}''$ = 1.1872420633E−13, $A_{18}''$ = 1.5798764234E−13,
$A_{20}''$ = 1.3425352595E−14, $A_{21}''$ = 3.1961386864E−16,
$A_{23}''$ = 8.2640583723E−16, $A_{25}''$ = 5.0212511084E−17,
$A_{27}''$ = 1.5492827151E−16, $A_{29}''$ = 7.1429537548E−19,
$A_{31}''$ = 1.1507858347E−18, $A_{33}''$ = −6.5780484704E−19,
$A_{35}''$ = 4.2158929949E−18, $A_{36}''$ = 7.6045895800E−22,
$A_{40}''$ = −1.0675040865E−22, and $A_{42}''$ = 2.0087308226E−20.

---

12. The freeform surface off-axial three-mirror imaging system of claim 1, wherein in the first three-dimensional rectangular coordinates system (X,Y,Z), a distance along the Z-axis negative direction between a center of the image sensor and the vertex of the tertiary mirror is about 391.895 mm.

13. The freeform surface off-axial three-mirror imaging system of claim 12, wherein the center of the image sensor deviates from the Z-axis in the positive direction of the Y axis, and a deviation is about 33.491 mm.

14. The freeform surface off-axial three-mirror imaging system of claim 13, wherein an angle of the image sensor with an XY plane in a clockwise direction is about 7.435°.

15. The freeform surface off-axial three-mirror imaging system of claim 1, wherein an angle along a sagittal direction is ranged from about −30° to about 30°, and an angle along a meridian direction is ranged from about 8° to about −9°.

16. The freeform surface off-axial three-mirror imaging system of claim 1, wherein an effective entrance pupil diameter of the freeform surface off-axial three-mirror imaging system is about 60 mm.

17. The freeform surface off-axial three-mirror imaging system of claim 1, wherein a wavelength of the freeform surface off-axial three-mirror imaging system is ranged from about 380 nm to about 780 nm.

18. The freeform surface off-axial three-mirror imaging system of claim 1, wherein an effective focal length of the freeform surface off-axial three-mirror imaging system is about 150 mm.

\* \* \* \* \*